US012432890B2

(12) United States Patent
Placido Almeida et al.

(10) Patent No.: US 12,432,890 B2
(45) Date of Patent: Sep. 30, 2025

(54) SYSTEM AND METHOD FOR COOLING A FREQUENCY INVERTER

(71) Applicant: WEG DRIVES & CONTROLS AUTOMAÇÃO LTDA., Santa Catarina (BR)

(72) Inventors: Anand Placido Almeida, Santa Catarina (BR); Itamar Fernandes Soares, Santa Catarina (BR); Carlos Afonso Hummelgen, Santa Catarina (BR); Adalberto José Rossa, Santa Catarina (BR)

(73) Assignee: WEG DRIVES & CONTROLS AUTOMACAO LTDA., Santa Catarina (BR)

( * ) Notice: Subject to any disclaimer, the term of this patent is extended or adjusted under 35 U.S.C. 154(b) by 287 days.

(21) Appl. No.: 18/548,843

(22) PCT Filed: Mar. 1, 2021

(86) PCT No.: PCT/BR2021/050089
§ 371 (c)(1),
(2) Date: Sep. 1, 2023

(87) PCT Pub. No.: WO2022/183257
PCT Pub. Date: Sep. 9, 2022

(65) Prior Publication Data
US 2024/0276685 A1    Aug. 15, 2024

(51) Int. Cl.
*H05K 7/20* (2006.01)
(52) U.S. Cl.
CPC ..... *H05K 7/20909* (2013.01); *H05K 7/20145* (2013.01); *H05K 7/20181* (2013.01); *H05K 7/20209* (2013.01); *H05K 7/209* (2013.01)

(58) Field of Classification Search
CPC .... H02M 1/00; H02M 7/003; H05K 7/20918; H05K 7/20945; H05K 7/20909; H05K 7/20209; H05K 7/20145
See application file for complete search history.

(56) References Cited

U.S. PATENT DOCUMENTS 5,825,642 A * 10/1998 Ishii ........................ H02M 3/28
361/25
6,233,149 B1 * 5/2001 Bailey ................ H05K 7/20918
361/679.01

(Continued)

FOREIGN PATENT DOCUMENTS

CN    109429469 B    10/2020
DE    20016013 U1   11/2001

(Continued)

OTHER PUBLICATIONS

PCT, International Search Report issued in connection with the corresponding International patent application No. PCT/BR2021/050089, dated Jun. 19, 2021, with English translation, 9 pages.

*Primary Examiner* — Mandeep S Buttar
(74) *Attorney, Agent, or Firm* — LUCAS & MERCANTI, LLP

(57) ABSTRACT

A system and method to provide heat sinking in a single step to the external environment, considering a physical separation between the power system (2) and the electronic system (3) with the standardized assembly of the openings, parts, ducts, seals and fastening means, simplifying assembly and facilitating the adjustment of ducts (4) between different sizes of a frequency inverter (1) and different sizes of an electrical panel (8) or a climatized room (9) and providing regulation of the temperature (65) on the heat sink (5), by varying the rotation speed of the fan (6) and varying the total losses (59) of the power semiconductor modules (7) without the need of applying a reduction factor to the current (Continued)

capacity of the frequency inverter (1) installed in an electrical panel (8) or in the climatized room (9).

27 Claims, 11 Drawing Sheets

(56) References Cited

U.S. PATENT DOCUMENTS

| | | | |
|---|---|---|---|
| 6,236,184 B1 | 5/2001 | Baker | |
| 6,320,776 B1 * | 11/2001 | Kajiura | H02M 7/003 |
| | | | 361/709 |
| 7,205,740 B1 | 4/2007 | Wei et al. | |
| 7,515,447 B2 * | 4/2009 | Ronkainen | G01K 15/00 |
| | | | 363/141 |
| 7,782,641 B2 | 8/2010 | Tashima et al. | |
| 9,190,923 B2 * | 11/2015 | Yuan | H02M 1/00 |
| 9,577,547 B2 | 2/2017 | Taira | |
| 9,781,860 B2 | 10/2017 | Hjort | |
| 9,867,314 B2 | 1/2018 | Lim et al. | |
| 10,485,146 B2 | 11/2019 | Daskalos et al. | |
| 2011/0122669 A1 * | 5/2011 | Santos | H02M 7/003 |
| | | | 363/141 |
| 2019/0239396 A1 * | 8/2019 | Hwang | H05K 7/20909 |

FOREIGN PATENT DOCUMENTS

| | | |
|---|---|---|
| DE | 102008027757 A1 | 11/2009 |
| EP | 0103412 B1 | 4/1987 |
| WO | 2016135931 A1 | 9/2016 |

* cited by examiner

SYSTEM AND METHOD FOR COOLING A FREQUENCY INVERTER

CROSS REFERENCE TO RELATED APPLICATION

This Application is a 371 of PCT/BR2021/050089 filed on Mar. 1, 2021, the content of which is incorporated herein by reference.

FIELD OF THE INVENTION

The present invention pertains to the field of production, conversion or distribution of electrical energy, specifically in the cooling and ventilation of components related to such operations, more specifically in structural modifications and methods to facilitate the cooling and ventilation of components such as frames, frameworks, panels, tables, shelves, and mainly enclosures or structural details of electrical apparatus, substations, switching devices, and mainly frequency inverters.

BACKGROUNDS OF THE INVENTION

Frequency inverters are electronic equipment used to drive and vary the speed of an electric motor, in alternating current, varying the voltage and frequency applied to the power terminals of said electric motor. By varying these and other parameters, it is possible to control other mechanical and electrical characteristics of said electric motor, such as torque, power or positioning.

Due to the inherent inefficiency of energy conversion processes, part of the electrical energy processed by said frequency inverter is converted into heat. The temperature reached by the frequency inverter depends, in addition to other factors, on how the generated heat is sunk, wherein the useful life and reliability of the electronic components related to the are directly temperature.

The main heat source of said frequency inverter is concentrated in the power semiconductor module, wherein the other electronic components, such as filters, capacitors and inductors, have a proportionally smaller contribution to heat generation.

Since the major heat contribution originates in said power semiconductor module, this is usually provided with a metallic surface specially designed for heat transfer by conduction. By joining said metallic surface to a heat sink with fins, the area of heat transfer by convection to the air is further increased.

The thermal transfer between the heat sink and the air can be increased by using fans, which generate an air flow that passes through said fins longitudinally, a phenomenon known as heat transfer by forced convection.

Said fan may be located in the cold part (blower fan) or hot part (exhauster fan) in said frequency inverter, according to the thermal design adopted for heat removal.

Said frequency inverters should preferably be installed in an electrical panel or climatized room for safety and control reasons, the heat generated by said frequency inverter being sunk inside the same, and subsequently removed by appropriate means.

Said electrical panel is a generally metallic structure in the form of a box, which has an electrical energy input circuit, various electrical equipment inside and which has one or more output circuits, which make the sectioning, and/or command, and/or control of an associated electrical load.

Said climatized room is usually a metallic or masonry structure, which has an electrical energy input circuit, which may further contain electrical panels and/or electrical equipment inside the same, which perform the sectioning, and/or command, and/or control of an electrical load, having some form of control of the internal environment, be it temperature, and/or humidity, and/or pressurization, and/or filtration.

The internal environment is considered the volume of air around the frequency inverter and enclosed by said electrical panel or said climatized room. The external environment is considered the air around said electrical panel or said climatized room.

The heat sunk by said frequency inverter, if not removed directly to the external environment, is retained within said electrical panel or said climatized room, which can rise the temperature of the internal environment around said frequency inverter frequency and impair reliability, reducing the useful life of the devices placed therein.

One of the known ways to reduce the temperature in the internal environment of said electrical panel is to increase the sinking area with the external environment, which must be sufficient to sink the heat generated by said frequency inverter. However, this method is neither practical nor economically viable, depending on the amount of heat needed to be sunk to reduce the temperature. In this way, it is identified that, in order to avoid an increase in the size of said electrical panel, it is necessary to remove the heat generated by said frequency inverter to the external environment.

In the case of the climatized room, it is necessary to increase the cooling, with the consequent increase in the consumption of electricity, becoming impractical and economically unviable.

Some methods used to remove the heat generated by said frequency inverter installed in an electrical panel or climatized room, such as door ventilation or ceiling ventilation, aim at promoting the exhaustion of hot air from the internal environment to the environment external.

The provision of ventilation in the door of said electrical panel, can be by means of a fan at the bottom (blower fan) to force an entrance of air from the external environment and/or alternatively by means of a fan located at the top (exhauster fan) to force an outlet of air to the external environment. Depending on the amount of heat to be removed from said electrical panel and/or due to installation restrictions, this solution may not meet the specified temperature limits.

Another widely known method uses ventilation in the ceiling of said electrical panel (exhauster fan), which has a greater air flow. As with ventilation on the door of said electrical panel, depending on the amount of heat to be removed from said electrical panel and/or due to installation restrictions, this solution may also not meet the specified temperature limits.

In the two aforementioned methods, the heat is removed in two steps, that is, the first step by the ventilation of said frequency inverter and the second step by ventilation of said electrical panel or said climatized room.

In order to solve the problems and shortcomings discussed above, there became imminent the objective of conceiving a design of said electrical panel or said climatized room that needs a smaller flow of air to be cooled, giving more competitiveness and reliability, due to reduced costs associated with purchasing, assembling and maintaining fewer fans and air filters.

An alternative would be to remove the heat generated by said frequency inverter directly to the external environment, where it would be possible to reduce or eliminate the air flow responsible for removing heat from the internal environment in said second step.

However, to solve this problem, that is, to sink the heat in a single step, directly to the external environment, an alternative would be to design said electrical panel or said climatized room, in order to provide a physical separation between the air that cools said frequency inverter and the air inside said electrical panel or said climatized room. In order to create two different environments, the current technique uses a mounting surface with an opening, and with said frequency inverter mounted in this opening, in such a way that the air that cools the frequency inverter (1) is separated from the air of the internal environment.

However, the assembly of such a technical solution becomes complex, considering different sizes of electrical panels, climatized rooms and frequency inverters, requiring a greater amount of non-standard parts, extra care with sealing, and more steps of assembly, significantly increasing the dimensioning complexity and the cost of the solution.

Another known method to create two distinct environments within said electrical panel or climatized room is to channel through ducts the air flow that cools said frequency inverter directly to the external environment, allowing heat sinking in a single step.

Duct cooling allows, in addition to physical separation, the advantage of choosing the air inlet and outlet points, without the complexity of assembly or the need of an opening in the mounting surface.

However, when adding said ducts for the physical separation of the frequency inverter, it also adds a restriction to the air flow of said fan, reducing cooling efficiency.

A common method of cooling is to maintain said fan running during the entire period that the frequency inverter remains in operation, with no relation between fan activation and the temperature of said frequency inverter. In this case, any restriction to the air flow and consequent increase in temperature is compensated by applying a reduction factor in the current capacity of said frequency inverter.

A second known method consists of controlling the activation of said fan within a temperature range of said frequency inverter, turning on said fan when an upper temperature limit is exceeded and turning off said fan when the lower temperature limit is reached. This on and off control allows to reduce the energy consumption of said frequency inverter and extend the useful life of the fan, but it still cannot compensate for a decrease in cooling due to the restriction imposed on the air flow. The consequent temperature rise is therefore compensated by applying a reduction factor to the current capacity of said frequency inverter.

In short, the present invention, in order to simultaneously solve all the aforementioned deficiencies, provides a system and method of cooling a frequency inverter (1), to provide heat sinking in a single step to the external environment, considering a physical separation between the power system (2) and the electronic system (3) with the standardized assembly of ducts and accessory components, and further providing regulation of temperature (65) in the heat sink (5), through the variation of the rotation speed of the fan (6) and the variation of the total losses (59) of the power semiconductor modules (7), without the need of applying a reduction factor to the current capacity of said frequency inverter (1) installed in an electrical panel (8) or in a climatized room (9).

STATE OF THE ART

Some state-of-the-art documents describe some solutions for cooling frequency inverters; however, there are still deficiencies related to energy use due to the reduction in current capacity.

Document EP 0 103 412 of 1983 presents a solution for cooling a frequency inverter comprising a sheet folded around the heat sink, in order to channel the external air of an electrical panel allowing to separate environments with rigid or flexible ducts and means of connection.

Document DE 200 16 013 U1 of 2000 presents a way to increase the sinking capacity of a panel with at least one heat generator using air inlet and outlet ducts, separating two chambers to improve the heat sinking of the said panel.

Document DE 10 2008 027 757 A1 of 2008, presents the use of a mounting plate with an opening for mounting the heat sink so that it can be cooled by the external air to the electrical panel in its rear portion, in order to separate environments into two air chambers for cooling and components, in order to allow the physical separation of the environments.

Document U.S. Pat. No. 9,867,314 B2 of 2015 presents a method for controlling the temperature by turning on and off the ventilation, considering a temperature to turn on and a temperature to turn off, conditioning the power supply so that it has enough voltage to power fan operation.

Document U.S. Pat. No. 6,236,184B1, granted in 2001, discloses an AC to DC to AC converter, which has an input to receive AC input, a rectifier to rectify the AC to DC input, and an inverter to reverse DC to AC about to leave. A load sensor detects load on the AC to DC to AC converter. A fan directs a cooling fluid to the AC to DC to AC converter. A fan control has an input coupled to the AC to DC to AC converter to receive DC from the same, wherein there are an input coupled to the load sensor and an output coupled to the fan. The fan control controls the fan at a variable speed in response to the load on the AC to DC to AC converter to vary the cooling fluid supplied by the fan to the AC to DC to AC converter.

U.S. Pat. No. 7,782,641, granted in 2010, provides a power conversion apparatus and method including a converter for converting AC power from a commercial power supply to DC power, a smoothing unit for smoothing DC power from the converter, an inverter for converting an output of the smoothing unit into other AC power, a control unit for controlling the inverter, and a current detector for detecting an output current from the inverter and providing a detection signal indicative of the same. There is further a cooling device to cool at least one of the converters or the inverter, wherein the detection signal of the current detector is inserted into the control unit so that the control unit estimates an inverter or converter temperature, based on the detection signal, and controls a cooling device for cooling based on the estimated temperature.

U.S. Pat. No. 7,205,740B2, granted in 2007, discloses a fan control device for a frequency converter, which is applied to a high-power frequency transformation system that installs fans according to heat sinking requirements and its switching operation, fault detection and control, and the fan control device includes a frequency transformer and a plurality of direct current fans connected to the frequency transformation system, and each fan is mounted in a desired position to sink heat in a frequency transformer housing by locking, sliding rails, pulling or locking, and each fan is connected to a fan control device, and a fan control device sensor detects the temperature of each temperature point set to switch the fans, controlling the operational number and speed of the fans, so as to improve the quantity, position, operability of the mounted fans, as well as reduce the energy consumption when the fans are in an idle state.

U.S. Pat. No. 5,825,642, granted in 1998, provides a power supply apparatus that includes a housing containing a component that generates heat during operation, a fan to cool the heat-generating component and a drive unit to drive the fan. The housing also contains a temperature detector for detecting the temperature in the housing and providing a signal representing the detected temperature. In response to the detected temperature representation signal, a control unit further supplies the drive unit with a control signal to change the fan rotation speed.

It should be emphasized that none of the above-mentioned documents of prior art can solve the technical problem by providing regulation of temperature (65) on the heat sink (5), through a variation in the rotation speed of the fan (6) and the variation in losses (59) of the power semiconductor modules (7), without the need of applying a reduction factor to the current capacity of said frequency inverter (1), since in all publications there is, to a greater or lesser extent, a reduction in the said current capacity.

BRIEF DESCRIPTION OF THE INVENTION

The present invention comprises a system and method to provide heat sinking in a single step to the external environment, considering a physical separation between the power system (2) and the electronic system (3) with the standardized assembly of the openings, parts, ducts, seals and fastening means, simplifying assembly and facilitating the adjustment of ducts (4) between different sizes of a frequency inverter (1) and different sizes of an electrical panel (8) or a climatized room (9) and providing regulation of temperature (65) on the heat sink (5), by varying the rotation speed of the fan (6) and varying the total losses (59) of the power semiconductor modules (7) without the need of applying a reduction factor to the current capacity of the frequency inverter (1) installed in an electrical panel (8) or in the climatized room (9).

BRIEF DESCRIPTION OF THE FIGURES

To assist in identifying the main features of this system and method and its forms of embodiment, the figures to which references are made are presented, as follows.

DETAILED DESCRIPTION OF THE INVENTION

Figures 1, 2:
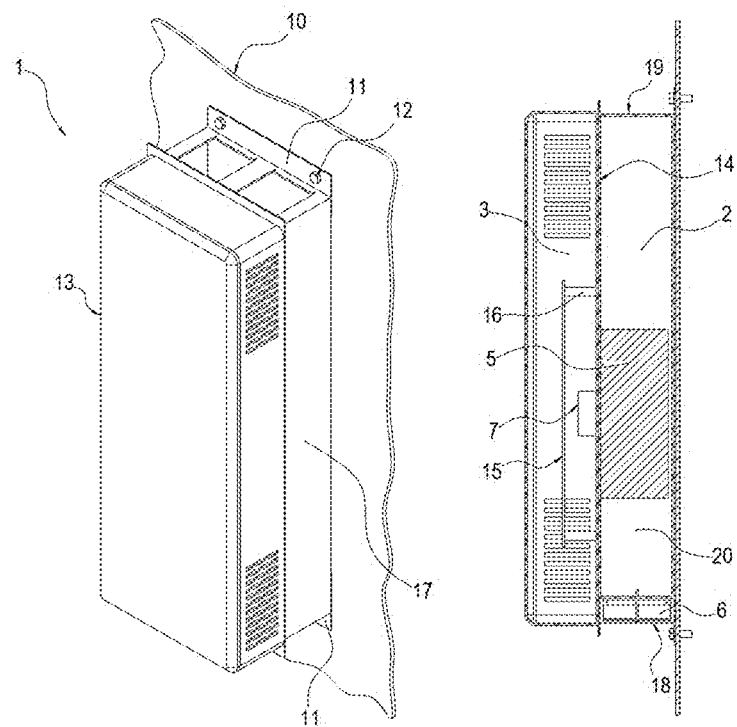
FIG. 1 shows the frequency inverter, highlighting (a) the fastening by tab and means of fastening on a mounting surface in the electrical panel or climatized room and (b) a cross section showing the physical separation between the electronic system and power system, said separation being provided by a separation plate (14).
FIG. 2 shows the connection piece A that standardizes the connection between the power system and the duct and its independent fastening of the fan.

The objective of the present invention is to provide a system and a method for heat sinking to the external environment of a frequency inverter (1), considering a physical separation between the power system (2) and the electronic system (3).

Said system of the present invention comprises at least one connection set A-C (56) or at least one connection set B-C (57) in an air inlet (18) or in an air outlet (19), in the said power system (2).

Said system further comprises means for regulating the temperature of the power system (2) preferably driven by the means for varying the rotational speed of the fan (6) and means for varying the switching frequency of the power semiconductor module (7), avoiding the need of reducing the current capacity of said frequency inverter (1) installed in said electrical panel (8) or said climatized room (9).

Said method of cooling a frequency inverter essentially comprises the phases of:
i) providing a separation plate (14) for separating an electronic system (3) and a power system (2) from a frequency inverter (1);
ii) assembling at least one connection set A-C (56) or at least one connection set B-C (57) in order to sink the heat generated by the frequency inverter (1) in a single step directly to the external environment;
iii) regulating the temperature in a single heat sink (5) or in a set of sinks (5) by means of a variation in the rotation speed of at least one fan (6) and/or a variation in the switching frequency of at least one power semiconductor module (7).

In phase i), according to FIG. 1, the frequency inverter (1) is mounted on a mounting surface (10) by means of the tabs (11) and fastened by fastening means (12) in an electrical panel (8) or a climatized room (9), wherein said mounting surface (10) can specifically be a mounting plate. From said configuration, said electronic system (3) comprises a cover with openings (13) and all the components contained within this volume that sink a smaller amount of heat in relation to the total losses of said frequency inverter (1), and there is a separation plate (14) opposite the cover (13) that delimits the physical separation between the electronic system (3) and the power system (2).

Said electronic system (3) comprises the components used in a portion of the control of the frequency inverter (1), which has at least one control board (15), with at least one processing unit (not shown in the Figures), being used for reading and controlling all the functions of said frequency inverter (1), wherein said control board (15) is fastened to the separation plate (14) through spacers (16).

Although said power semiconductor module (7) is contained in the defined volume of said electronic system (3), it is additionally considered as an integral part of said power system (2), as it sinks a large part of the heat generated in its operation to a heat sink (5) contained in said power system (2).

Said power system (2) consists of all components contained within the volume delimited by the separation plate (14) and the tunnel (17), comprising at least one air inlet (18) at one end and at least one air outlet (19) at the other end.

Said power system (2) contains the components that generate and sink most of the total losses of said frequency inverter (1), with at least one heat sink (5) grouped to a power semiconductor module (7), at least one fan (6), at least one air inlet (18) and at least one air outlet (19).

The power semiconductor module (7) may contain means used for rectifying the input voltage and/or converting energy from said frequency inverter (1), such as a set of rectifier diodes and/or semiconductor switches.

The heat generated by the losses of the power semiconductor module (7) is transferred by conduction to the heat sink (5). The physical separation created by the separation plate (14) and tunnel (17) form an air channel (20) in the power system (2), wherein all the air flow generated by said fan (6) is used for cooling the heat sink (5), preferably containing heat sinking fins, along its entire length, maximizing the heat sinking.

The separation plate (14) delimits the volumes, prevents air circulation between the systems and provides mechanical support for the assembly of components and parts of said power system (2) and said electronic system (3).

The tunnel (17) is formed by one or more plates joined together and delimiting with said separation plate (14) the air flow of said fan (6). Said fan (6) can be mounted on the air inlet (18) or on the air outlet (19) of the air channel (20). When said fan (6) is mounted on said air inlet (18), it performs an air intake against the heat sink (5). If mounted on the air outlet (19), it exhausts the air.

In phase (ii) the assembly of a connecting piece A (21) in connection with a duct (4) on one side begins, and on the other hand there is its fastening through fastening means (22) by means of through holes (26) in an opening (23). Said fan (6) is fastened in the opening (23) independently of the fastening of said connecting piece A (21). Said connecting piece A (21) creates a standardized connection between the opening (23) and the duct (4) with a defined diameter, in order to facilitate the fastening and sealing therebetween.

A cylindrical end (24) of said connecting piece A (21) has a cross section smaller than the internal diameter of the duct (4) so that the duct (4) surrounds said end (24). Another end (25) of said connecting piece A (21) has a geometry designed in such a way that through holes (26) present at said end (25) of said connecting piece A (21) are aligned with fastening points (27) and in said opening (23) and that the cross section of said end (25) of said connecting piece A (21) surrounds said fan (6), said connecting piece A (21) being geometrically designed to substantially surround said fan (6).

The fan (6) is fastened independently in said opening (23) through the fastening points (28) and fastening means (29). A seal (30) is mounted on a surface (31) and used to seal the contour of said opening (23), in order to avoid a mixture of the air that cools said power system (2) with the internal environment of said electrical panel (8) or said climatized room (9). A shoulder (32) of said surface (31) is used to limit the compression of said seal (30).

Said connecting piece A (21) can be fastened to the air inlet (18) and/or air outlet (19), which has the opening (23) and fastening points (27), wherein the fan (6) is mounted.

Figure 3:
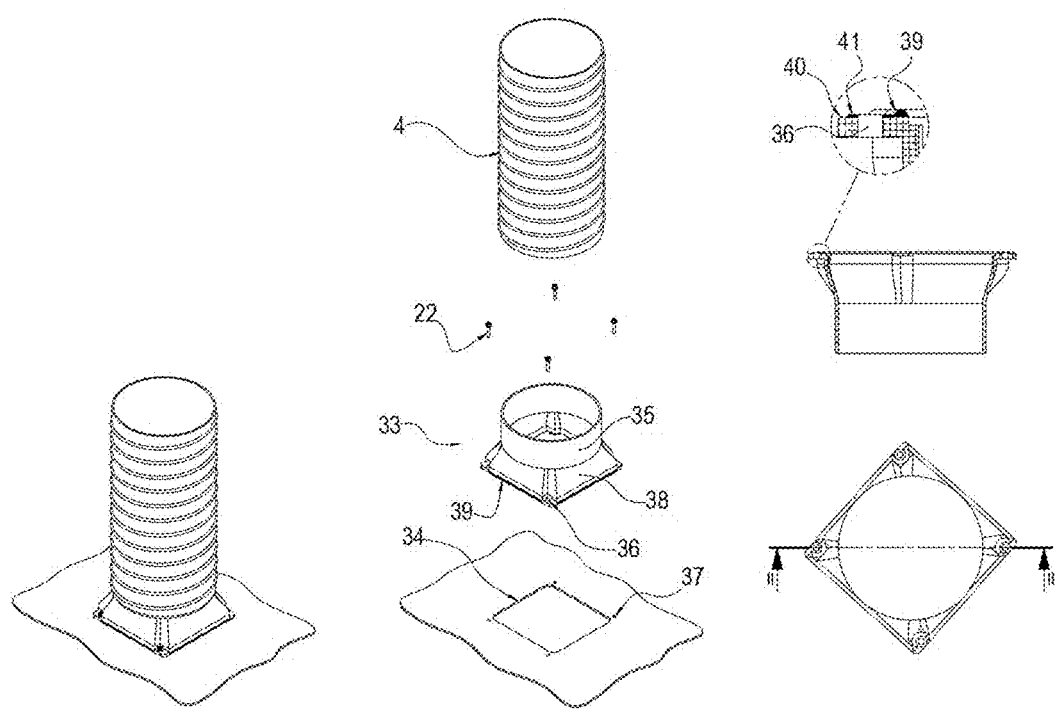
FIG. 3 shows the connection piece B that standardizes the connection between the power system and the duct.

In the assembly shown in FIG. 3, there is a connecting piece B (33) in connection with said duct (4) and its fastening through fastening means (22) in an opening (34), wherein said connection piece B (33) is geometrically designed in order to create an interface between the opening (34) and the duct (4) with a defined diameter, in order to facilitate the fastening and a seal.

A cylindrical end (35) has a cross section smaller than the internal diameter of said duct (4) so that said duct (4) surrounds said end (35). Said connection piece B (33) has through holes (36) for the passage of said fastening means (22).

At the ends of said opening (34), fastening points (37) are arranged for fastening the connecting piece B (33) through fastening means (22). Said end (38) has a geometry designed in such a way that the through holes (36) of the connecting piece B (33) are aligned with said fastening points (37) of said opening (34).

A seal (39) is mounted on a surface (40) and used to seal said opening (34), in order to avoid said mixing of the air that cools the power system (2) with the internal environment of the said electrical panel (8) or said climatized room (9). The shoulder (41) of said surface (40) is used to limit the compression of said seal (39).

Said connecting piece B (33) can be fastened to the air inlet (18) and/or air outlet (19), which has the opening (34) and the fastening points (37), wherein the fan (6) is not mounted.

Figure 4:
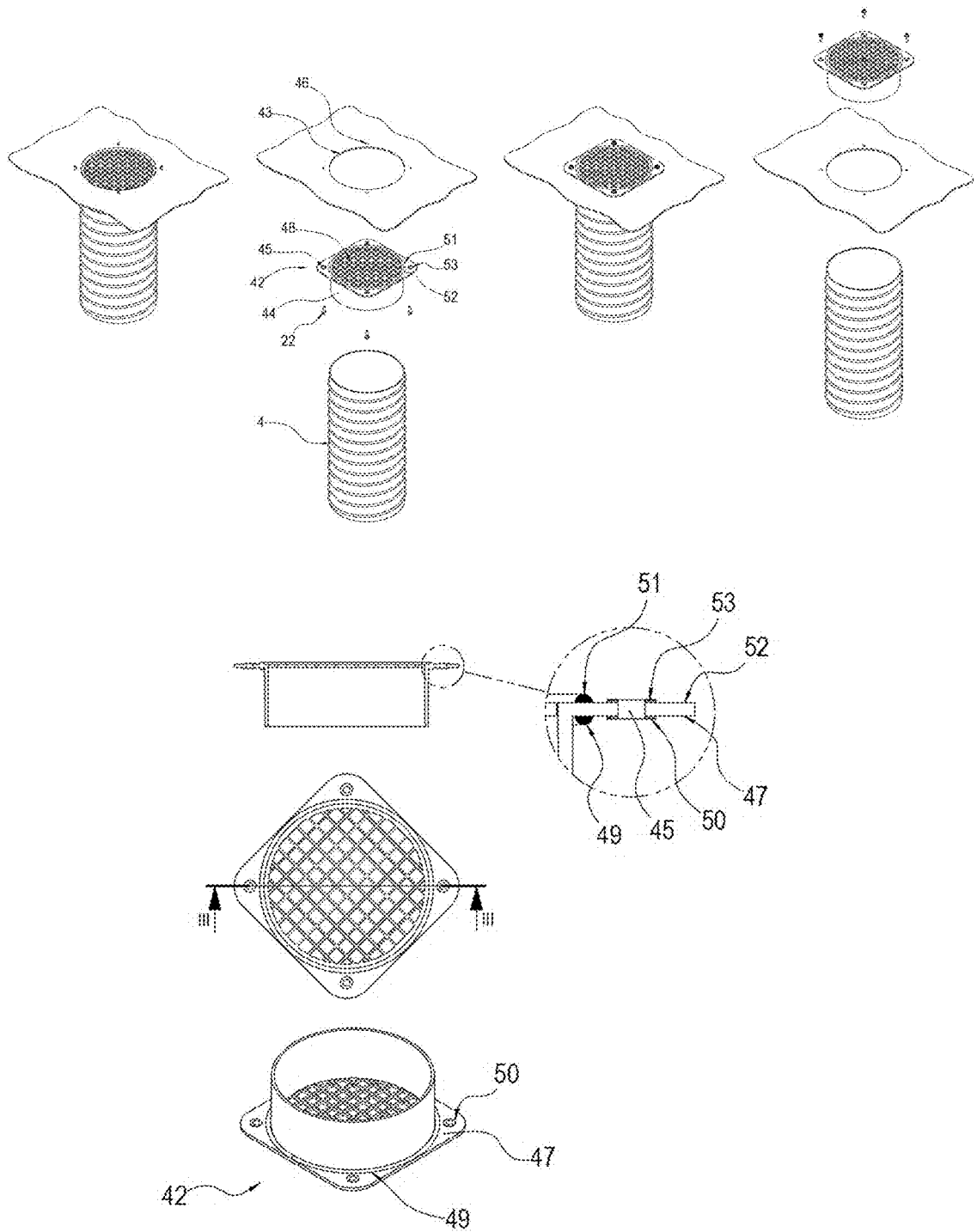
FIG. 4 shows the connection piece C that standardizes the connection between the duct and the opening in an electrical panel or climatized room, showing the two forms of fastening.

FIG. 4 shows two alternatives for assembling a connecting piece C (42) with a connection to said duct (4) and its fastening through said fastening means (22) aligned to the fastening points (46) of an opening (43).

FIG. 4 further shows a cross section of said connecting piece C (42), further comprising a top and isometric view, showing a through hole (45), comprising, on one side, a seal (49), a shoulder (50) and a surface (47), and, on the opposite side, also a seal (51), a shoulder (53) and a surface (52).

Said connecting piece C (42) is geometrically designed in order to create a connection between said opening (43) located on a surface of said electrical panel (8) or said climatized room (9) and said duct (4) with a defined diameter, in order to facilitate the fastening and sealing. One end (44) has a cross section smaller than the internal diameter of the duct (4) so that the duct (4) surrounds the end (44).

The connecting piece C (42) has through holes (45) for passing the fastening means (22) for fastening with the opening (43). The through holes (45) of the connection piece C (42) must be aligned with the fastening points (46) of the opening (43).

In the vicinity of the opening (43), fastening points (46) are arranged for fastening said connecting piece C (42) through said fastening means (22). Both said opening (43) and the fastening points (46) can be made by a third party.

Said opening (43) can be made on any surface of said electrical panel (8) or said climatized room (9), which can carry out the exhaustion or suction of the external environment air.

Said surface (47) has a grid (48) with a pattern of openings sufficient to prevent the entry of objects. Said seal (49) is mounted on said surface (47) and used to seal said opening (43), in order to avoid mixing the air that cools the power system (2) with the internal environment of said electrical panel (8) or said climatized room (9).

If said connecting piece C (42) is mounted on the outside of said electrical panel (8) or said climatized room (9), the opening (43) is sealed by said seal (49). Said shoulder (50) of said surface (47) is used to limit the compression of said seal (49).

Said seal (51) is mounted on said surface (52) and used to seal said opening (43), in order to avoid mixing the air that cools the power system (2) with the internal environment of the said electrical panel (8) or said climatized room (9).

If said connecting piece C (42) is mounted on the inside of said electrical panel (8) or said climatized room (9), said opening (43) is sealed by said seal (51). Said shoulder (53) of said surface (52) is used to limit the compression of said seal (51).

In the representation of FIG. 4, it is possible to observe a circular geometry, by allowing a smaller length of said end (44) and by the ease of creating the opening (43) with a circular cutting tool. Said opening (43) may alternatively have another geometry, provided that said through holes (45) of said connection piece C (42) are aligned with said fastening points (46) of said opening (43) and said seal (49, 51) can seal said opening (43).

Figure 5:
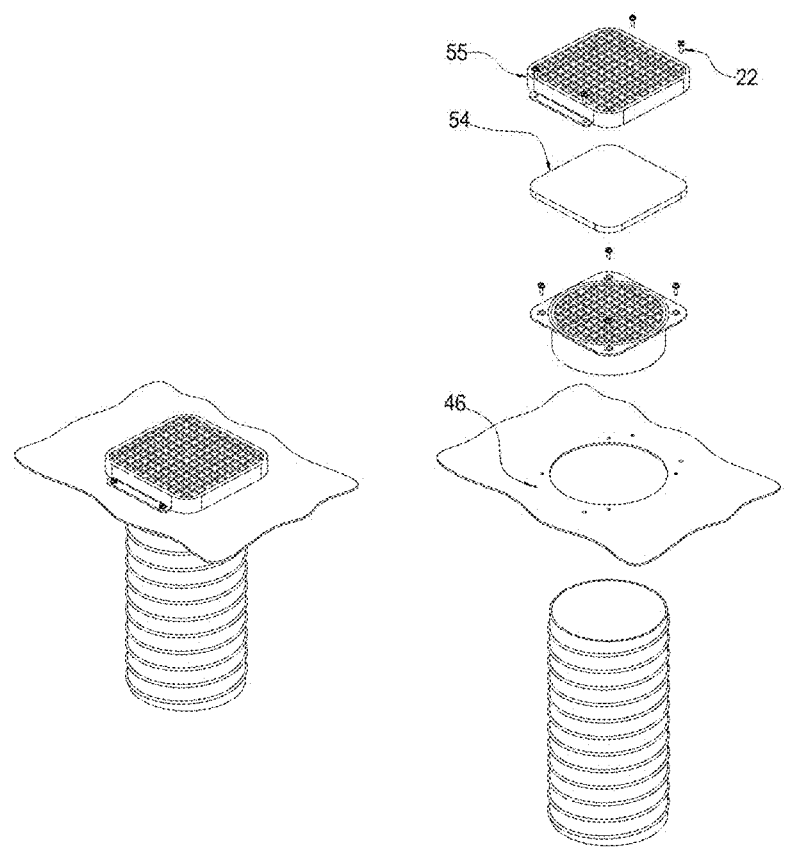
FIG. 5 shows the connection piece C that standardizes the connection between the duct and the opening in an electrical panel or climatized room, with means for optional coupling of a filtering apparatus.

In FIG. 5, an assembly of said connecting piece C (42) is shown for a connection with said duct (4) and its fastening through fastening means (22) in said opening (43), in to which a filtering apparatus (54) housed in a cover (55) and fastened to said connecting piece C (42) can be added. The cover (55) is provided with a volume that can be used to assemble an element/apparatus to retain solid and/or liquid particles present in the external environment.

Figure 6:
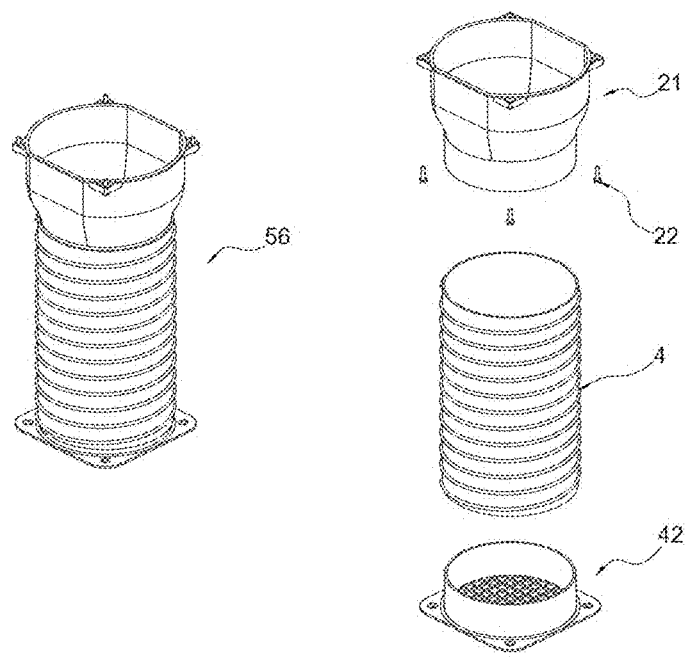
FIG. 6 shows the connection set A-C.

FIG. 6 shows the connection set A-C (56) consisting of the connection piece A (21), said fastening means (22), said duct (4) and said connection piece C (42) forming a single set.

Figure 7:
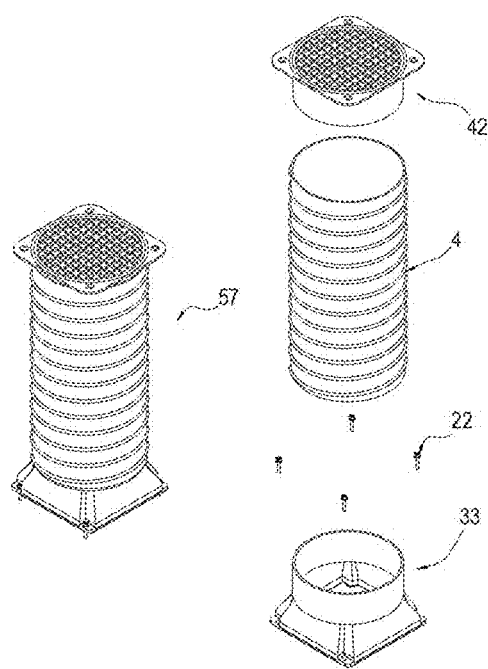
FIG. 7 shows the connection set B-C.

FIG. 7 shows a connection set B-C (57) consisting of said connection piece B (33), said fastening means (22), said duct (4) and said connection piece C (42) forming a single set.

One of the objectives of the present invention is to provide said connection set A-C (56) and said connection set B-C (57) for mounting in different sizes of said frequency inverters (1), electrical panels (8) or climatized rooms (9), to sink heat in a single step to the external environment.

From the definition of the diameter of said ducts (4), with the standardization of said connecting parts A (21), B (33), C (42) and the standardization of said openings (23), (34), (43), the investment in injection molds and parts inventory is reduced.

Figure 8:
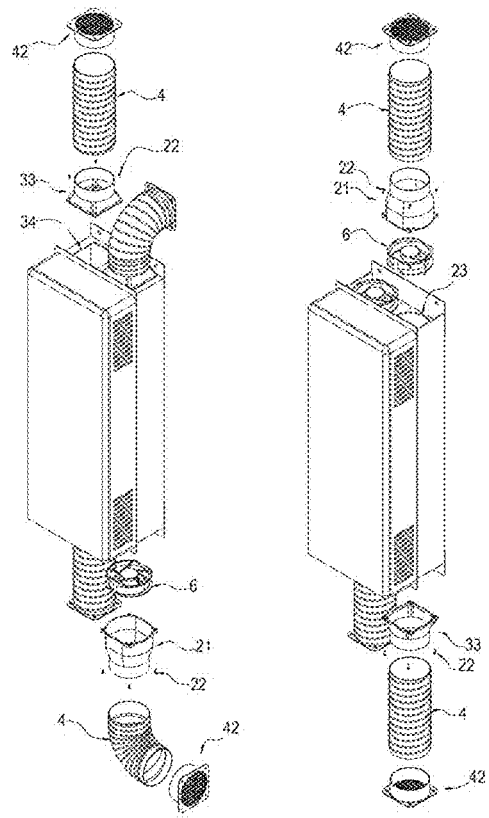
FIG. 8 shows the embodiment 1, object of the invention.

In FIG. 8, embodiment 1 is shown, using said flexible ducts (4) for the suction of cold air and exhaustion of hot air from said power system (2) in a single step, in said panel (8) or in said climatized room (9).

The air that cools said power system (2) of said frequency inverter (1), installed in said electrical panel (8) or in said climatized room (9), has its suction from the air of the external environment carried out through an air inlet carried out by at least one said connecting piece C (42) and the exhaustion of the air to the external environment carried out through an air outlet by at least one said connecting piece C (42).

Embodiment 1 allows said frequency inverter (1) installed in said electrical panel (8) or said climatized room (9) to have a maximum air temperature around the electronic system (3) different from the maximum inlet air temperature of the power system (2).

Said power system (2), designed with a high degree of protection, is constructed in a sealed manner in order to provide a physical barrier to considerably prevent the passage of liquid and solid particulate materials dispersed in the external environment to the internal environment, mainly water and dust. In FIG. 8, when assembled with at least one connection set A-C (56) and at least one connection set B-C (57), a high degree of protection of the power system (2) is maintained until the parts C (42), mounted on said electrical panel (8) or said climatized room (9).

The number of said connection sets A-C (56) is equal to the number of fans (6) thermodynamically necessary for cooling a power system (2). The number of said connection sets B-C (57) is equivalent to at least the number of fans (6) necessary for cooling said power system (2).

Figure 9:
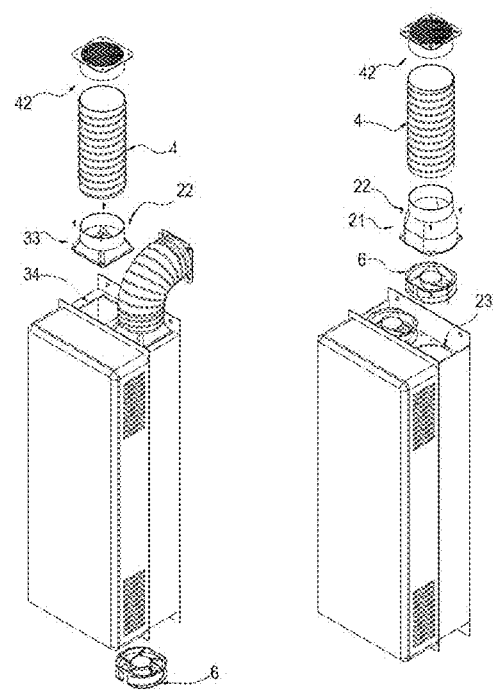
FIG. 9 shows the embodiment 2, object of the invention.

In FIG. 9, embodiment 2 is shown, using said flexible ducts (4) to exhaust hot air from said power system (2) in a single step in said electrical panel (8) or in said climatized room (9).

The air suction from said power system (2) is carried out through an opening (23) or (34) and uses the air from the internal environment of an electrical panel (8) or a climatized room (9) to cooling.

The exhaustion of air from the power system (2) is carried out through at least one connection set A-C (56) associated with said fan (6), or at least one connection set B-C (57).

The air that cools said electrical panel (8) or said climatized room (9) is supplied by any means that allows an air inlet.

The exhaustion of hot air from said power system (2) to the external environment is carried out by at least one said connecting piece C (42). The number of sets A-C (56), when the hot air outlet is associated with a fan (6), is equal to the number of fans (6) needed to cool the power system (2).

The number of connection sets B-C (57), when the hot air outlet is not associated with a fan (6), is at least an equivalent number of fans (6) necessary for cooling the power system (2).

Figure 10:
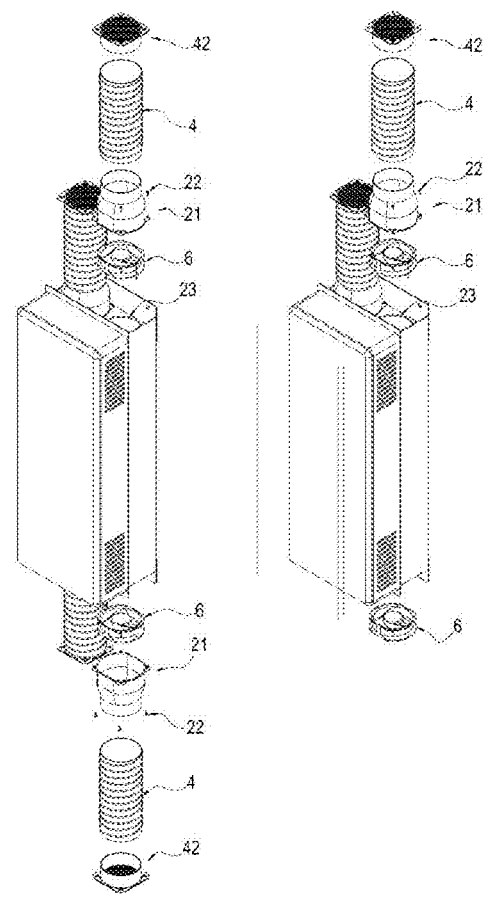
FIG. 10 shows the embodiment 3, object of the invention.

In FIG. 10 (a) and FIG. 10 (b), the embodiment 3 is shown, using said fan (6) for the suction of cold air and another said fan (6) for exhausting the hot air from said power system (2) in a single step, in said electrical panel (8) or in said climatized room (9).

In FIG. 10 (a), the air that cools said power system (2) of said frequency inverter (1), installed in said electrical panel (8) or said climatized room (9), has its suction of air from the external environment through an air inlet carried out by at least one said connection set A-C (56) and the exhaustion of air to the external environment through an air outlet carried out by at least one said set of A-C connection (56).

Alternatively, as shown in FIG. 10 (b), the suction of from the internal environment of said electrical panel (8) or said climatized room (9) is carried out through said opening (23) and exhausting the hot air by said connection set A-C (56).

Embodiment 3, as shown in FIG. 10 (a), allows the frequency inverter (1) installed in said electrical panel (8) or said climatized room (9) to have a maximum air temperature around said electronic system (3) different from the maximum inlet air temperature of said power system (2).

Said power system (2), designed with a high degree of protection, is built in a sealed manner to provide a physical barrier to considerably prevent the passage of liquid and solid particulate materials dispersed in the external environment to the internal environment, mainly water and dust. In FIG. 10 (a), when assembled with said connection sets A-C (56), a high degree of protection of the power system (2) is maintained until the parts C (42), mounted in said electrical panel (8) or a so-called climatized room (9).

In embodiment 3, in FIG. 10 (a), the number of connection sets A-C (56) is equal to the number of fans (6) required for cooling the power system (2). In embodiment 3, in FIG. 10 (b), the number of connection sets A-C (56) is equivalent to the number of ducts associated with the exhaustion of hot air from the power system (2).

Figure 11:
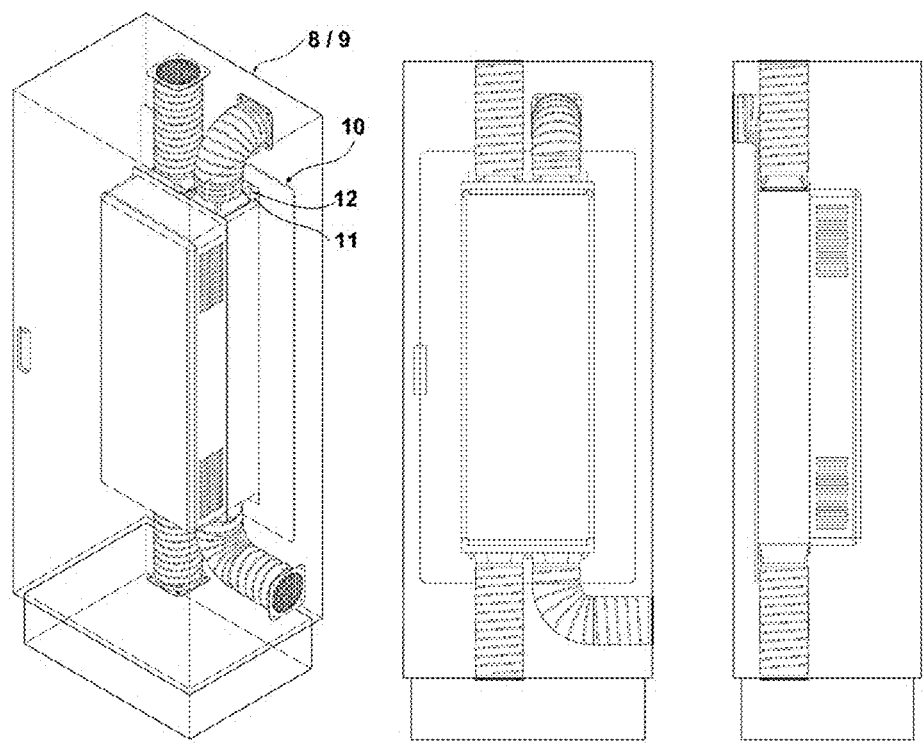
FIG. 11 shows a perspective of one of the embodiments, showing the adjustment possibilities, in which the duct was stretched, curved or shrunk to adapt the interfaces of the electrical panel or climatized room (9).

In FIG. 11 (a), a perspective of one of the embodiments is shown, showing the adjustment possibilities, in which the duct (4) was stretched, curved or shrunk to adapt the interfaces of the electrical panel (8) or climatized room (9). FIG. 11 (b) shows a front view and FIG. 11 (c) shows a side view.

Figure 12:
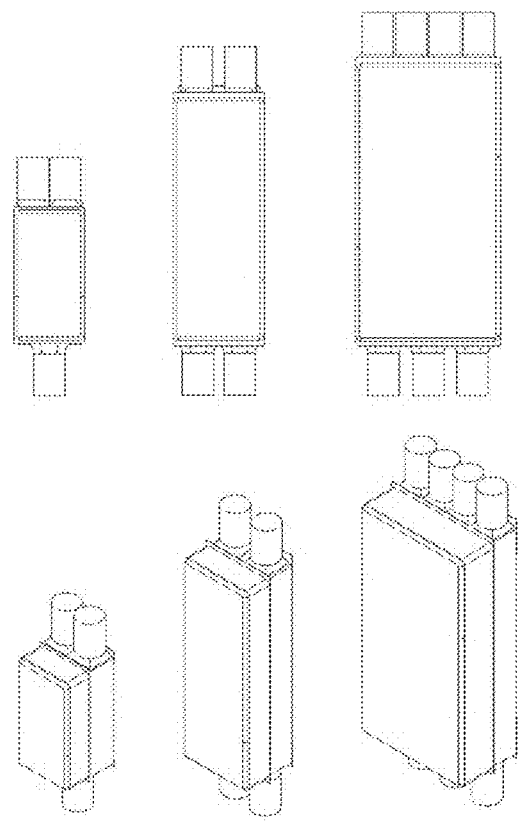
FIG. 12 shows some possibilities for varying the size of the frequency inverters and varying the number of ducts.

FIG. 12 shows a perspective of one of the embodiments, showing some possibilities for varying the size of the frequency inverters (1) and varying the number of ducts (4).

When creating the conditions for heat sinking in a single step, as embodied in the embodiments presented with said power system (2), it is necessary to know the behavior of the power system (2) to establish the conditions for regulating the temperature of said heat sink (5).

The thermal design of said power system (2) takes into account the normal operating conditions of said frequency inverter (1). Under these conditions, characteristics such as voltage, current, ambient temperature, losses, material properties of the heat sink (5) and the nominal air flow $Q_{nom}$ of the fan (6) must fall within a range of values defined names.

These nominal values are used to estimate the technical feasibility, size and sinking capacity of said power system (2), among other characteristics described in the technical specification.

The power system (2) must meet the technical specifications necessary to sink a specific amount of heat, to meet the normal operating conditions in their variation ranges and prevent them from causing overheating and damage to said frequency inverter (1).

Figure 13:
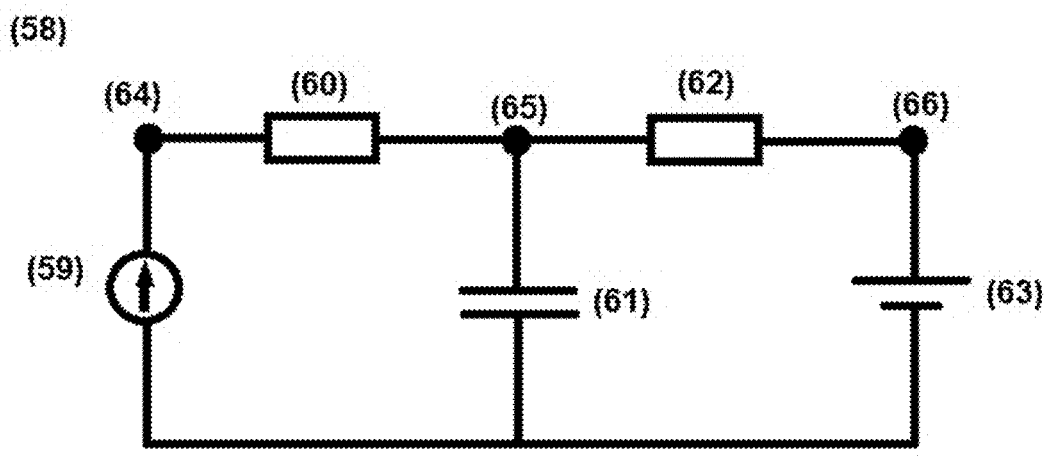
FIG. 13 shows the thermal model used to describe the invention.

The power system (2), defined to operate within a range of nominal values, can be modeled as a thermal circuit (58), shown in FIG. 13, consisting of a heat source (59), a thermal resistance (60), a thermal capacitance (61), a thermal resistance (62) and a heat source (63).

The thermal model (58) is used to describe the behavior of temperatures (64), (65) and (66) present in the power semiconductor module package (7), heat sink (5) and external environment, respectively.

The heat source (59) represents the heat generated by the total losses of the power semiconductor module (7). The thermal resistance (60) represents the resistance to heat transfer by conduction between the power semiconductor module (7) and the heat sink (5).

The thermal capacitance (61) represents the heat stored in the power system (2). The thermal resistance (62) represents the resistance to heat transfer by natural or forced convection, which occurs between the air and the power system (2). In the forced convection, the thermal resistance (62) can vary depending on the variation in the rotation speed of the fan (6), increasing or decreasing the heat transfer between the solid and fluid parts.

The heat source (63) represents the heating or cooling of the external environment to impose a temperature (66). Its value is not influenced by the heat sinking of the power system (2). With the power semiconductor module (7) mounted together with a heat sink (5) in the power system (2), the value of the thermal resistance (60) is constant.

With the power system (2) with all its parts defined and assembled, the value of the thermal capacitance (61) is constant. The heat source (59) is a function of the losses of the power semiconductor module (7), which are dependent on the voltage, current and switching frequency imposed on the diodes and/or semiconductor switches of the power semiconductor module (7).

The heat source (59) and the thermal resistance (62) are variables whose ranges of variation are defined for a given assembly of a power system (2). When the frequency inverter (1) is off, the temperatures (64) and (65) are equal to the temperature (66), that is, equal to the temperature of the external environment.

In phase (iii), when the frequency inverter (1) is activated, the heat source (59) starts to act and the temperatures (64) and (65) start to rise. The temperature (65) reached by the heat sink (5) in steady-state is a direct function of the heat source (59) and the thermal resistance (62). The thermal capacitance (61) defines the speed at which the temperature (65) increases or decreases according to the variation of the heat source (59) and the thermal resistance (62).

Figure 14A:
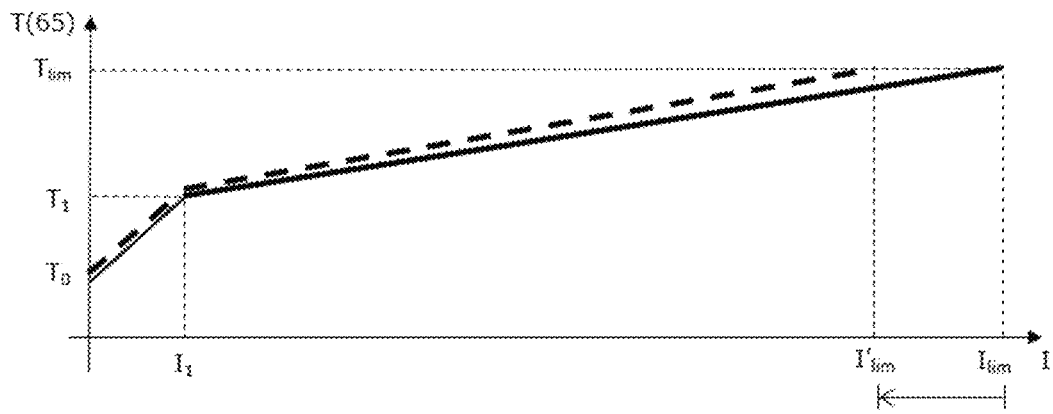
FIG. 14 shows the graphs for the operation of the relation between temperature (65), air flow (Q) and total losses (59), maintaining the fan rotation speed ($\omega$) and the switching frequency ($f_{sw}$) of the constant power semiconductor module.
Figure 14B:
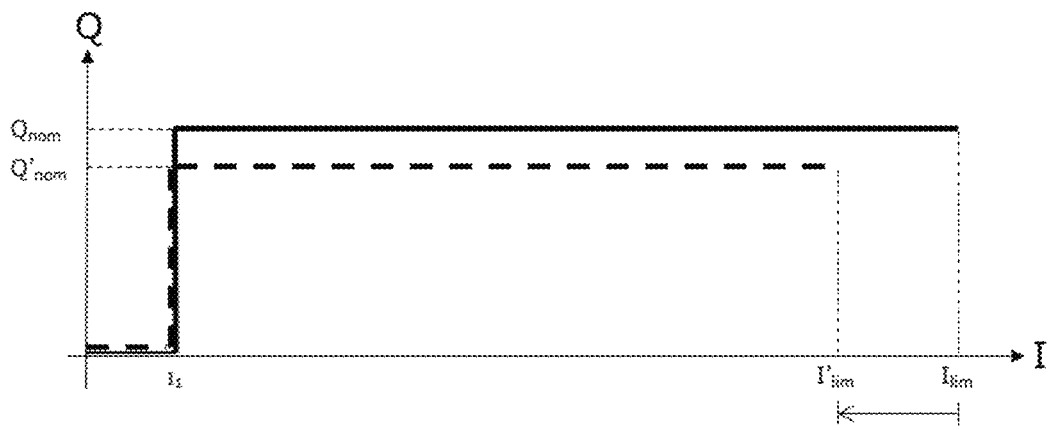
Figure 14C:
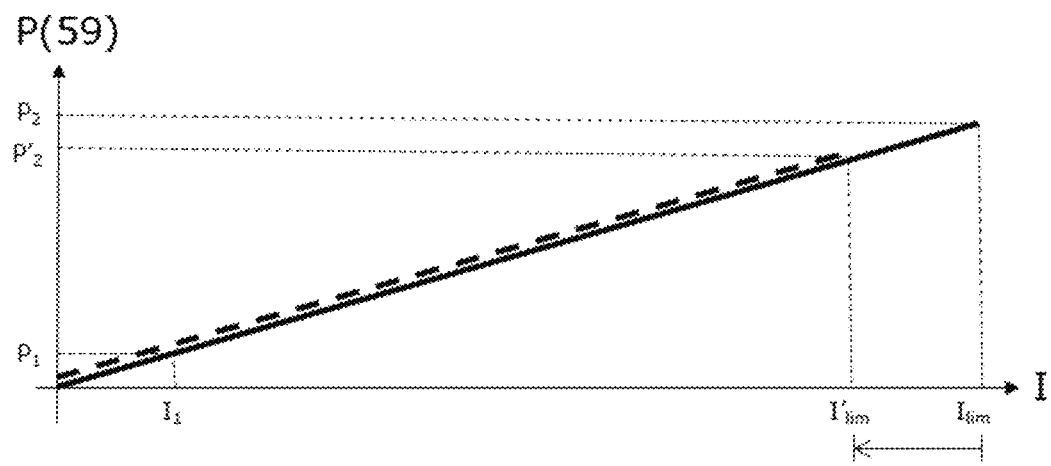

FIG. 14 shows the steady-state graphs of the behavior of the power system (2), for the temperature (65) on the heat sink (5), the air flow of the fan (6) and the losses (59) of the power semiconductor module (7), maintaining the rotation speed of the fan (6) and the switching frequency in the power semiconductor module (7) constant.

Considering that, for the construction of the graphs in FIG. 14, the supply voltage is a constant value, the total losses (59) will be a function of the current passing through the power semiconductor module (7).

The solid lines represent the behavior without air flow restrictions of the power system (2) and the dashed lines represent the behavior with the air flow restrictions added by embodiments 1, 2 or 3 to the power system (2).

With the frequency inverter (1) turned off, the air flow and total losses (59) are zero and the temperatures of the power system (2) are in equilibrium at $T_0$. With the frequency inverter (1) operating, the total losses (59) of the power semiconductor module (7) begin to be conducted to the heat sink (5). As the fan (6) remains off, the heat sink (5) carries out the heat sinking by natural convection, until the total losses $P_1$, generated by a current $I_1$, are sufficient to rise the temperature (65) to the temperature $T_1$, driving the fan (6) at nominal rotation speed $\omega_{nom}$, generating a nominal air flow $Q_{nom}$, initiating heat sinking by forced convection in the power system (2).

From the point of total losses $P_1$, generated by a current $I_1$, when increasing the current and consequently the total losses (59) in the power semiconductor module (7), the temperature (65) increases. The thermal design limit of the power system (2) is defined when reaching the temperature $T_{lim}$, generated by a current $I_{lim}$.

The temperature $T_{lim}$ and the current $I_{lim}$ are established values for the safe operation of the power system (2), so that if any of them is exceeded, overtemperature or overcurrent protection must act to protect the frequency inverter (1).

When applying embodiments 1, 2 or 3 to the power system (2), a restriction is added to the air passage, generating a reduction in the air flow from $Q_{nom}$ to $Q'_{nom}$ and consequently a lower heat sinking.

Up to the point of total loss $P_1$, generated by current $I_1$, there is the same rise slope up to temperature $T_1$ at temperature (65). When exceeding the temperature $T_1$, with the current increase, there is also an increase in the total losses (59). With a smaller air flow $Q'_{nom}$, the slope of the increase of temperature (65) is greater, reaching the temperature $T_{lim}$ at a current value $I'_{lim}$, smaller than $I_{lim}$.

In this condition, a reduction factor of capacity of said frequency inverter (1) is applied, limiting the supplied current to a value $I''_{lim}$, less than $I_{lim}$, so that a thermal overload does not occur.

Considering that it is not desirable to reduce the current capacity of the frequency inverter (1) when using embodiments 1, 2 or 3, a method is proposed by the invention so that throughout the range of current use of said frequency inverter (1), the temperature $T_{lim}$ is not exceeded, avoiding the need of applying a reduction factor.

The problem is solved by regulating the temperature (65) on the heat sink (5) at a selectable value of temperature $T_3$, acting on the variation of the thermal resistance (62) by varying the rotation speed of the fan (6) and the variation of the heat source (59) through the variation of the switching frequency of the semiconductor switches of the power semiconductor module (7).

The control board (15) reads a temperature sensor that measures the temperature (65) and compares the same with the value of the selected temperature. The firmware installed on the control board (15), depending on the processing, performs the variation of the rotation speed of the fan (6) and/or the variation of the switching frequency of the semiconductor switches of the power semiconductor module (7).

Alternatively, the temperature (65) can be read at another point in the power system (2) that is more favorable for installing the temperature sensor.

A fan (6) is used that, at rotation speed $\omega_{nom}$, is capable of generating a sufficient air flow so that the temperature (65) of the power system (2) does not exceed $T_{lim}$, wherein said fan (6) can be used at a maximum rotation speed $\omega_{max}$ greater than $\omega_{nom}$, thus allowing a first gap in the current capacity of the frequency inverter (1).

Additionally, the variation of the switching frequency of the semiconductor switches of the power semiconductor modules (7) is used, allowing a second gap in the capacity by reducing the total losses (59).

FIG. 15 shows the steady-state graphs of the behavior of the power system (2), temperature (65), air flow of the fan (6), total losses (59) of the power semiconductor module (7), the variation of the switching frequency in the power semiconductor module (7) and the variation of the rotation speed of the fan (6), respectively.

The solid lines represent the behavior without air flow restrictions of the power system (2) and the dashed lines represent the behavior with the air flow restrictions added by embodiments 1, 2 or 3 to the power system (2).

With the frequency inverter (1) turned off, the air flow and total losses (59) are zero and the temperatures of the power system (2) are in equilibrium at $T_0$.

With the frequency inverter (1) operating, the total losses (59) of the power semiconductor module (7) begin to be conducted to the heat sink (5). As the fan (6) remains off, the heat sink (5) carries out the heat sinking by natural convection, until the total losses $P_3$, generated by a current $I_3$, are sufficient to rise the temperature (65) to the temperature $T_3$.

When the total losses $P_3$, generated by an increase in current, are exceeded, with the switching frequency at $f_{max}$, the fan (6) is activated, generating an air flow and initiating heat sinking by forced convection in the heat sink (5). The control board (15) performs the reading of temperature (65) constantly, regulating the rotation speed of the fan (6), generating a sufficient air flow to regulate the temperature (65) at temperature $T_3$.

When the fan (6) reaches the nominal rotation speed $\omega_{nom}$, the first limit of the rotation speed variation of the fan (6) is reached, generating a nominal air flow $Q_{nom}$, at a point with total losses $P_4$, generated by a current $I_4$. With the addition of the air flow restriction, the slope of the rotation speed curve of the fan (6) is altered to compensate for the added restriction. When the fan (6) reaches the nominal rotation speed $\omega_{nom}$, due to the added restriction, it generates a nominal air flow $Q'_{nom}$, smaller than $Q_{nom}$, at a total loss value $P'_4$, generated by a current $I'_4$, both smaller than the total losses $P_4$, generated by the current $I_4$.

From the point of total losses $P_4$, generated by current $I_4$, the variation of the switching frequency of the power semiconductor module (7) begins, with the rotation speed of the fan (6) maintained at $\omega_{nom}$ and the air flow maintained in $Q_{nom}$. In order to maintain the regulation of temperature (65) at temperature $T_3$, the control board (15) maintains the total losses of the power semiconductor module (7) at the value of the total losses $P_4$, even with the increase in current, by varying the switching frequency.

Likewise, with the air flow restriction, at a point with total losses $P'_4$, generated by a current $I'_4$, smaller than the point of total losses $P_4$, generated by a current $I_4$, there is started the variation of the switching frequency of the power semiconductor module (7), with the rotation speed of the fan (6) maintained at $\omega_{nom}$ and the air flow maintained at $Q'_{nom}$. In order to maintain the regulation of temperature (65) at the temperature $T_3$, the total losses of the power semiconductor module (7) are maintained at the value of the total losses $P'_4$, even with the increase in current, by varying the switching frequency.

The switching frequency varies between a maximum frequency $f_{max}$ and a minimum frequency $f_{min}$. The maximum frequency $f_{max}$ is a selected value and the minimum frequency $f_{min}$ is a limit value wherein the control and stability of the operation of the frequency inverter (1) are possible.

When the value of the minimum switching frequency $f_{min}$ is reached, at a point with total losses $P_5$ equal to $P_4$, generated by a current $I_5$, a second variation of rotation speed of the fan (6) starts, maintaining the switching frequency in $f_{min}$ and varying the rotation speed of the fan (6) and the air flow.

With air flow restriction, when the value of the minimum switching frequency $f_{min}$ is reached, at a point with total losses $P'_5$ equal to $P'_4$, generated by a current $I'_5$, smaller than the point of total losses $P_5$, generated by a current $I_5$, a second variation of the rotation speed of the fan (6) starts, maintaining the switching frequency at $f_{min}$ and varying the rotation speed of the fan (6) and the air flow.

From the point of the total losses $P_5$, generated by the current $I_5$, the fan (6) starts the rotation speed variation from the nominal rotation speed $\Omega_{nom}$, generating an air flow sufficient to regulate the temperature (65) at temperature $T_3$ until reaching the maximum rotation speed $\omega_{max}$ and consequently the maximum air flow $Q_{max}$, at a point of total losses $P_6$, generated by a current $I_6$.

With the restriction to the air flow, from the point of the total losses $P'_5$, generated by the current $I'_5$, the fan (6) starts the rotation speed variation from the nominal rotation speed $\omega_{nom}$, generating an air flow sufficient to regulate the temperature (65) at temperature $T_3$ until reaching the maximum rotation speed $\omega_{max}$, which due to the added constraint, generates a maximum air flow $Q'_{max}$, less than $Q_{max}$, at a loss point totals $P'_6$, generated by a current $I'_6$.

Alternatively, from the point at which the temperature (65) is equal to $T_3$, the speed variation of the fan (6) or the switching frequency variation can be performed, jointly or independently, without any alteration of the point of total losses $P_6$ or $P'_6$, generated by a current $I_6$ or $I'_6$.

From the point of total losses $P_6$, generated by a current $I_6$, with the rotation speed of the fan (6) maintained at the maximum rotation speed $\omega_{max}$ and the switching frequency maintained at $f_{min}$, with the increase in current, the temperature (65) starts to increase, until the current reaches the value $I_{lim}$, in which the temperature (65) in the heat sink (5) reaches the temperature $T_4$, lower than $T_{lim}$.

With the air flow restriction, from the point of total losses $P'_6$, generated by a current $I'_6$, the rotation speed of the fan (6) is maintained at the maximum rotation speed $\omega_{max}$ and the switching frequency is maintained at $f_{min}$. As the current increases, regulation of temperature (65) at temperature $T_3$ is no longer possible. Depending on the reduction in air flow caused by the restriction, the temperature (65) in the $I_{lim}$ stream can reach a temperature between $T_4$ and $T_{lim}$.

In this condition, it is possible to reach $I_{lim}$, without exceeding $T_{lim}$, even with the air flow restriction, not being necessary to use a reduction factor to limit the use of the frequency inverter (1) with the embodiments 1, 2 or 3.

Figure 15A:
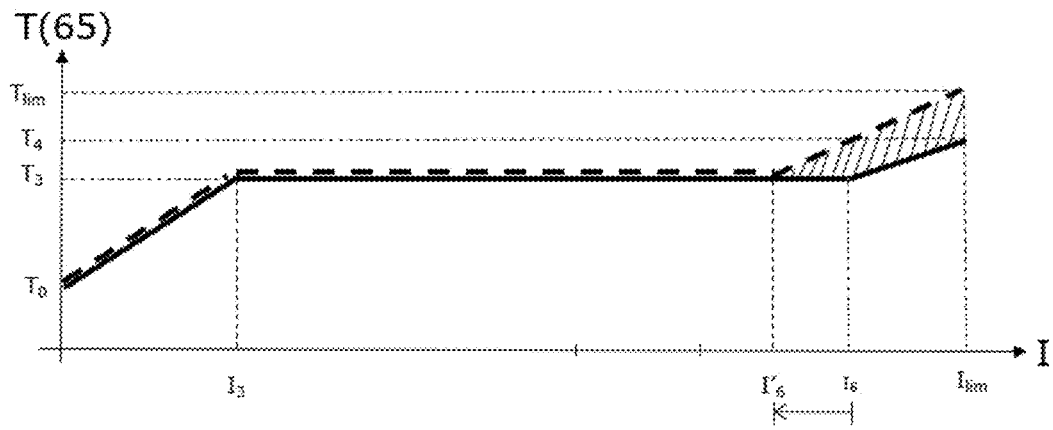
FIG. 15 shows the graphs for the operation of the relation between temperature (65), air flow (Q) and total losses (59), considering the variation in the fan rotation speed ($\omega$) and the variation of the switching frequency ($f_{sw}$) of the power semiconductor module, object of the invention.
Figure 15B:
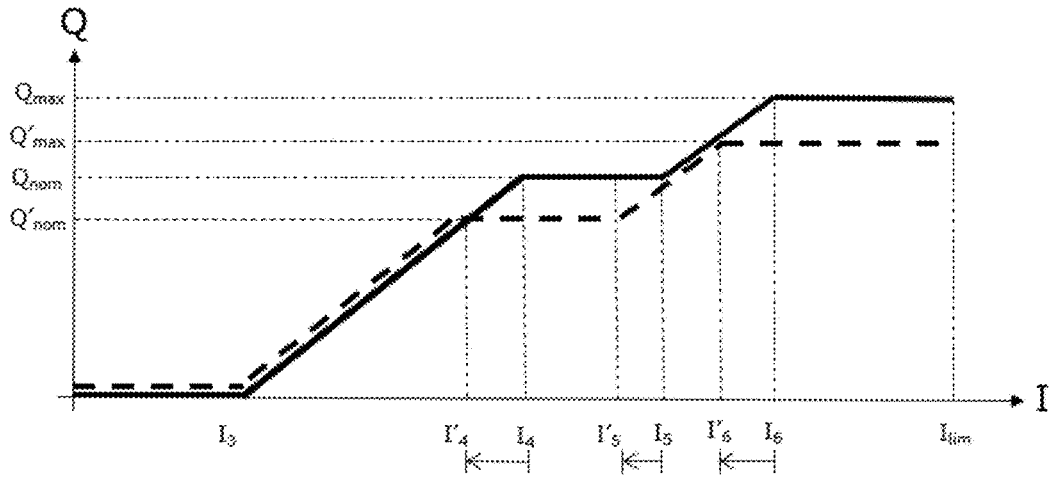
Figure 15C:
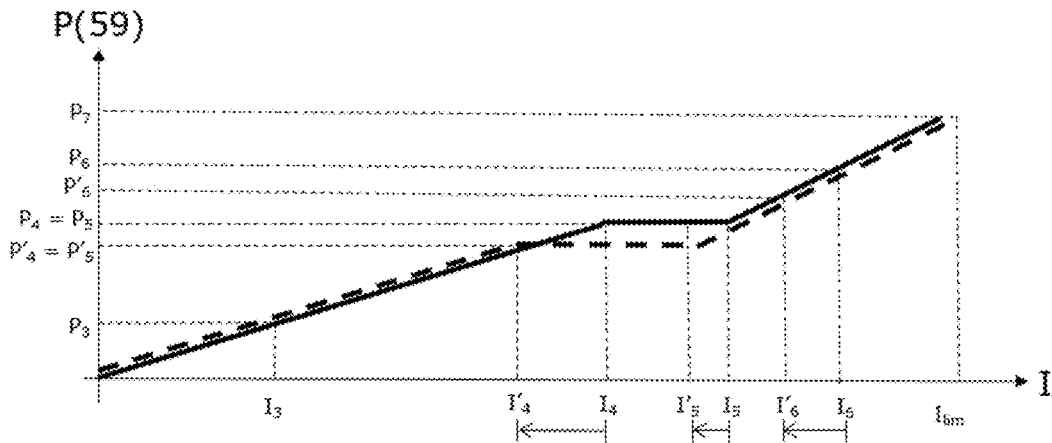
Figure 15D:
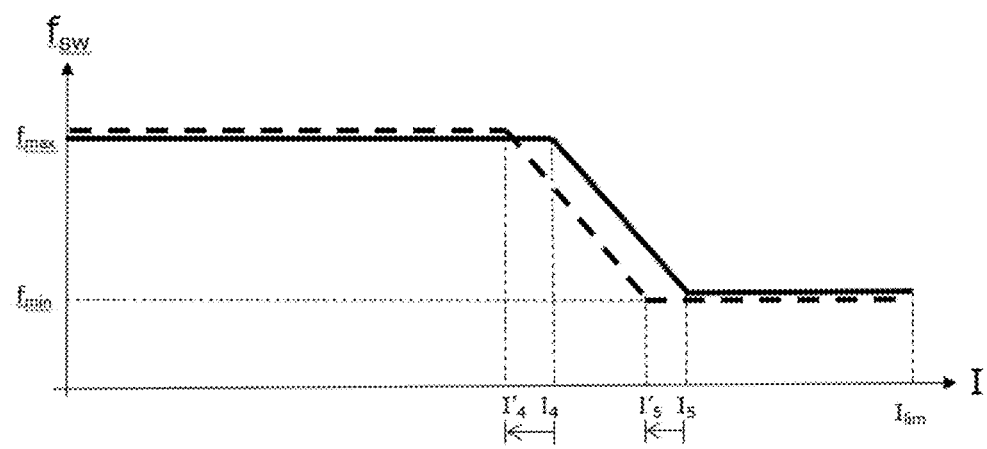
Figure 15E:
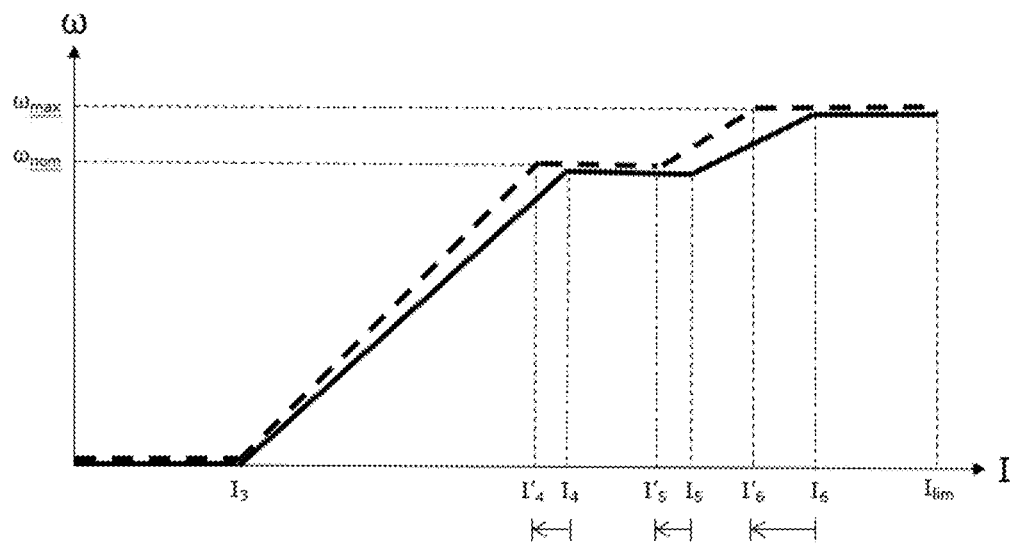
Figure 15F:
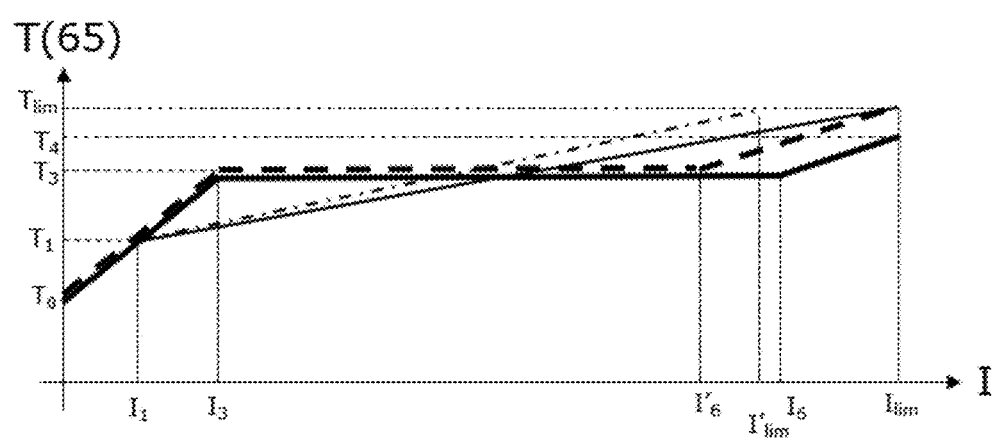

FIG. 15f shows the superimposed curves of temperature (65) for comparing the results for the same power system (2), showing that under both conditions, with and without the application of the restriction added by embodiments 1, 2 or 3, applying the regulation of temperature (65), in the limit condition of the current in $I_{lim}$, said temperature (65) does not reach the temperature $T_{lim}$, corroborating the hypotheses as mentioned above.

Those skilled in the art will value the knowledge presented here and will be able to reproduce the invention in the presented embodiments and in other variants, encompassed by the scope of the attached claims.

The invention claimed is:

1. A COOLING SYSTEM ASSOCIATED WITH A FREQUENCY INVERTER, wherein said frequency inverter (1) comprises an electronic system (3) and a power system (2) separated by means of a separation plate (14), the cooling system comprising at least one fan (6) mounted on the air inlet (18) or on the air outlet (19) of the air channel (20); at least one connection set A-C (56) or at least one connection set B-C (57) mounted on an air inlet (18) or an air outlet (19) on said power system (2); and further comprising a control board for regulating a temperature of the power system (2) for varying a rotational speed of the fan (6) and means for varying a switching frequency of a power semiconductor module (7) between a maximum switching frequency $f_{max}$ and a minimum switching frequency $f_{min}$ according to a necessary total losses (59); wherein the variation of the rotation speed of the fan (6) and the variation of the total losses (59) of the power semiconductor modules (7) happens without the need of applying a reduction factor to a current capacity of the frequency inverter (1).

2. THE SYSTEM according to claim 1, wherein said power system (2) provides a physical barrier to the passage of liquid and solid particulate materials from the external environment, and further comprises at least one tunnel (17), an air inlet (18), an air outlet (19) and a heat sink (5) in contact with said power semiconductor module (7), wherein said frequency inverter (1) is mounted in a mounting surface (10), inside an electrical panel (8), or alternatively in a climatized room (9).

3. THE SYSTEM according to claim 1, wherein the connection set A-C (56) preferably comprises a connection piece A (21), a duct (4) and a connection piece C (42), said connecting piece A (21) being geometrically designed to substantially surround a fan (6), and further comprising means for fastening and sealing with an opening (23) of the power system (2), and a cylindrical end (24) with a cross section smaller than the internal diameter of the duct (4).

4. THE SYSTEM according to claim 3, wherein the fan (6) is fastened independently in said opening (23) through the fastening points (28) and fastening means (29).

5. THE SYSTEM according to claim 1, wherein the connection set B-C (57) preferably comprises a connection piece B (33), a duct (4) and a connection piece C (42), said connecting piece B (33) being geometrically designed for fastening and sealing with an opening (34) of the power system (2), and further comprising a cylindrical end (35) with a cross section smaller than the internal diameter of the duct (4).

6. THE SYSTEM according to claim 1, wherein the connecting piece C (42) is geometrically designed for fastening and sealing with an opening (43) on any surface of said electrical panel (8) or said climatized room (9), providing a connection between said opening (43) and said duct (4) with a defined diameter.

7. THE SYSTEM according to claim 6, wherein when said connecting piece C (42) is mounted on the inside of said electrical panel (8) or said climatized room (9), said opening (43) is sealed by the seal (51), wherein the surface (52) further comprises a shoulder (53) limiting the compression of said seal (51).

8. THE SYSTEM according to claim 6, wherein when said connecting piece C (42) is mounted on the outside of said electrical panel (8) or said climatized room (9), said opening (43) is sealed by the seal (49), wherein the surface (47) also comprises a shoulder (50) limiting the compression of said seal (49).

9. THE SYSTEM according to claim 6, wherein the connection piece C (42) further comprises a circular end (44) with a cross section smaller than the internal diameter of the duct (4) so that the duct (4) surrounds the end (44).

10. THE SYSTEM according to claim 6, wherein the connecting piece C (42) further comprises a surface (47) comprising a grid (48) with a pattern of openings sufficient to prevent the entry of objects.

11. THE SYSTEM according to claim 1, further comprising, at one end of the power system (2), a connection set A-C (56) and at the other end of the power system (2) a connection set B-C (57).

12. THE SYSTEM according to claim 1, characterized in that it optionally comprises further comprising, only one end of the power system (2), a set A-C (56) or alternatively a connection set B-C (57).

13. THE SYSTEM according to claim 1, further comprising, at both ends of the power system (2), a connection set A-C (56) for the suction of external air and the exhaustion of hot air from said power system (2).

14. THE SYSTEM according to claim 11, wherein the connection sets A-C (56) and/or the connection sets B-C (57), when mounted at the ends of said power system (2), maintain the high degree of protection until the connection piece C (42), in order to provide a physical barrier to prevent the passage of liquid and solid particulate materials dispersed in the external environment to the internal environment, mainly water and dust.

15. THE SYSTEM according to claim 11, wherein the number of said connection sets A-C (56) is equal to the number of fans (6) thermodynamically necessary for air suction and/or hot air exhaustion of said power system (2).

16. THE SYSTEM according to claim 11, wherein the number of said connection sets B-C (57) is equivalent to at least the number of fans (6) thermodynamically necessary for air suction and/or exhaustion of the hot air from said power system (2).

17. THE SYSTEM according to claim 12, wherein the number of said connection sets A-C (56) or of said connection sets B-C (57) is equivalent to the number of ducts required for hot air exhaustion of said power system (2).

18. THE SYSTEM according to claim 13, wherein the number of said connection sets A-C (56) is equal to the number of fans (6) required for the suction of external air and the exhaustion of hot air from said power system (2).

19. THE SYSTEM according to claim 1, wherein the physical separation created by the separation plate (14) and tunnel (17) form an air channel (20) in the power system (2), through which all the air flow generated by said fan (6) is used for cooling at least one heat sink (5).

20. THE SYSTEM according to claim 1, wherein the connecting piece C (42) additionally comprises a filtering apparatus (54) fastened through a cover (55).

21. A METHOD FOR COOLING A FREQUENCY INVERTER comprising the phases of: i) providing a separation plate (14) for separating an electronic system (3) and a power system (2) from a frequency inverter ii) assembling at least one connection set A-C (56) and/or at least one connection set B-C (57) so as to provide at least one air flow within said power system (2) in a single step, directly to an external environment; iii) regulating a temperature in a single heat sink (5) or in a set of sinks (5) by a control board to vary a in the rotation speed of at least one fan (6) and/or a variation in a switching frequency of at least one power semiconductor module (7) between a maximum switching frequency fmax and a minimum switching frequency fin according to a necessary total losses (59); wherein the variation of the rotation speed of the fan (6) and the variation of the total losses (59) of the power semiconductor modules (7) happens without the need of applying a reduction factor to a current capacity of the frequency inverter (1).

22. THE METHOD according to claim 21, further comprising a suction of external air and exhaustion of hot air from said power system (2) concomitantly in phase (ii), through an air inlet by at least one said connecting piece C (42) and the exhaustion of air to the external environment through an air outlet by at least one said connecting piece C (42).

23. THE METHOD according to claim 21, further comprising a suction of air from the internal environment of an electrical panel (8) or a climatized room (9) through at least one opening (23) associated with a fan (6) or at least one opening (34), leading the air from said internal environment through said power system (2) in phase (ii), wherein the exhaustion of air to the external environment takes place through an air outlet by at least one said connecting piece C (42).

24. THE METHOD according to claim 21, further comprising a suction of air from the external environment with the aid of at least one fan (6) and the exhaustion of hot air from said power system (2) also with aid of at least one fan (6) in phase (ii), through an air inlet by at least one said connecting piece C (42) and the exhaustion of the air to the external environment through an air outlet by at least one at least one said connecting piece C (42).

25. THE METHOD according to claim 21, wherein in phase (iii) the regulation of the temperature (65) of the power system (2) at a temperature $T_3$ by varying the rotation speed of the fan (6) between zero rotational speed and the maximum rotational speed $\omega_{max}$ depending on the air flow necessary for the regulation of said temperature (65).

26. THE METHOD according to claim 21, wherein the regulation of the temperature (65) of the power system (2) at a temperature $T_3$ is carried out from the variation of the switching frequency of the power semiconductor module (7) between the maximum switching frequency $f_{max}$ and the minimum switching frequency $f_{min}$ according to the total losses (59) necessary for the regulation of said temperature (65).

27. THE METHOD according to claim 21, wherein a the control board (15) performs the speed variation of the fan (6) and the switching frequency variation (7), from the point at which the temperature (65) is equal to $T_3$, jointly or independently, without any alteration of the point of total losses $P_6$ or $P'_6$, generated by a current $I_6$ or $I'_6$.

* * * * *